United States Patent
Lee et al.

(10) Patent No.: US 8,747,719 B2
(45) Date of Patent: Jun. 10, 2014

(54) METHOD FOR MANUFACTURING INSERT-MOLDED COVER

(75) Inventors: Han-Ming Lee, New Taipei (TW);
Chih-Chien Hung, New Taipei (TW);
Hsiang-Sheng Chou, New Taipei (TW);
Ching-Hsien Chang, New Taipei (TW)

(73) Assignee: Foxconn Technology Co., Ltd., New Taipei (TW)

( * ) Notice: Subject to any disclaimer, the term of this patent is extended or adjusted under 35 U.S.C. 154(b) by 86 days.

(21) Appl. No.: 13/171,707

(22) Filed: Jun. 29, 2011

(65) Prior Publication Data
US 2011/0256310 A1  Oct. 20, 2011

Related U.S. Application Data

(62) Division of application No. 12/187,397, filed on Aug. 7, 2008.

(30) Foreign Application Priority Data

May 9, 2008 (CN) .......................... 2008 1 0301531

(51) Int. Cl.
| | | |
|---|---|---|
| H05K 5/02 | (2006.01) | |
| H05K 5/00 | (2006.01) | |
| B05D 3/00 | (2006.01) | |
| B05D 3/12 | (2006.01) | |
| B28B 7/38 | (2006.01) | |

(52) U.S. Cl.
USPC .............. 264/265; 427/133; 427/327; 29/600

(58) Field of Classification Search
USPC ........................... 427/126.3; 264/265; 29/600
See application file for complete search history.

(56) References Cited

U.S. PATENT DOCUMENTS

| | | | |
|---|---|---|---|
| 7,120,005 B1 * | 10/2006 | Luch ............................ | 361/220 |
| 2006/0055084 A1 | 3/2006 | Yamaguchi et al. | |
| 2006/0237326 A1* | 10/2006 | Ger et al. ....................... | 205/321 |
| 2008/0251282 A1* | 10/2008 | Huang et al. .................. | 174/255 |
| 2009/0205983 A1* | 8/2009 | Estlander ...................... | 206/305 |

FOREIGN PATENT DOCUMENTS

| | | |
|---|---|---|
| CN | 1717323 A | 1/2006 |
| JP | 8-142110 | 6/1996 |
| JP | 2004-055248 | 2/2004 |
| JP | 2007-050630 | 3/2007 |

* cited by examiner

*Primary Examiner* — Michael Cleveland
*Assistant Examiner* — Austin Murata
(74) *Attorney, Agent, or Firm* — Novak Druce Connolly Bove + Quigg LLP

(57) ABSTRACT

A method for manufacturing an insert-molded cover for electronic devices, including manufacturing a metallic body, processing the metallic body by a chemical method and forming an oxide film on a surface of the metallic body, and molding a plastic antenna lid on the metallic body by insert molding so that the plastic antenna lid is attached on the oxide film.

8 Claims, 2 Drawing Sheets

METHOD FOR MANUFACTURING INSERT-MOLDED COVER

CROSS-REFERENCE TO RELATED APPLICATION

The present application is a divisional application of U.S. patent application Ser. No. 12/187,397, now U.S. Pat. No. 7,989,079, filed on Aug. 7, 2008.

BACKGROUND OF THE INVENTION

1. Field of the Invention

The present disclosure relates to insert-molded covers and, more particularly, to an insert-molded cover used for an electronic device and a method for manufacturing the insert-molded cover.

2. Discussion of the Related Art

Electronic devices, such as notebook computers, mobile phones, or personal digital assistants (PDAs), are very popular and widely used. Covers of electronic devices are generally made of two kinds of materials, plastic and metal. Generally, a metallic cover has a nicer appearance and a better surface feeling than a plastic one, thus metallic covers for electronic devices are now becoming more and more popular.

Because the metal has a good electromagnetic shielding capability, a portion of the cover corresponding to an antenna of an electronic device is made of plastic, so that signals can be received and transmitted through the plastic portion, and certain functions would not be weaken by electromagnetic shielding. Generally, the metallic cover includes a metallic body and a plastic antenna lid fixed to the metallic body by hook locking or rivet jointing. However, these fixing means easily leave a gap between the plastic antenna lid and the metallic body, such that the plastic antenna lid easily becomes loosened from the metallic body due to the gap. In addition, a thin metallic cover is susceptible to crack at the junction where the plastic antenna lid is fixed to the metallic body by hook locking or rivet jointing. Therefore, the mechanical strength and durability of the metallic cover is relatively compromised.

What is needed, therefore, is a new insert-molded cover that overcomes the above mentioned disadvantages.

SUMMARY

In one aspect, an insert-molded cover for electronic devices includes a metallic body, a plastic antenna lid integrally formed with the metallic body, and an oxide film formed on a surface of the metallic body for attaching the plastic antenna lid.

In another aspect, a method for manufacturing an insert-molded cover for electronic devices includes following steps. Firstly, a metallic body is manufactured. Secondly, the metallic body is processed by a chemical method and an oxide film is formed on a surface of the metallic body. Thirdly, a plastic antenna lid is molded on the metallic body by insert molding so that the plastic antenna lid is attached on the oxide film.

Other advantages and novel features will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of the present insert-molded cover. Moreover, in the drawings, like reference numerals designate corresponding parts throughout the several views.

DETAILED DESCRIPTION OF THE EMBODIMENTS

Reference will now be made to the drawings to describe preferred embodiments of the present insert-molded cover, in detail. The insert-molded cover is used for electronic devices such as notebook computers, and mobile phones.

Figure 1:
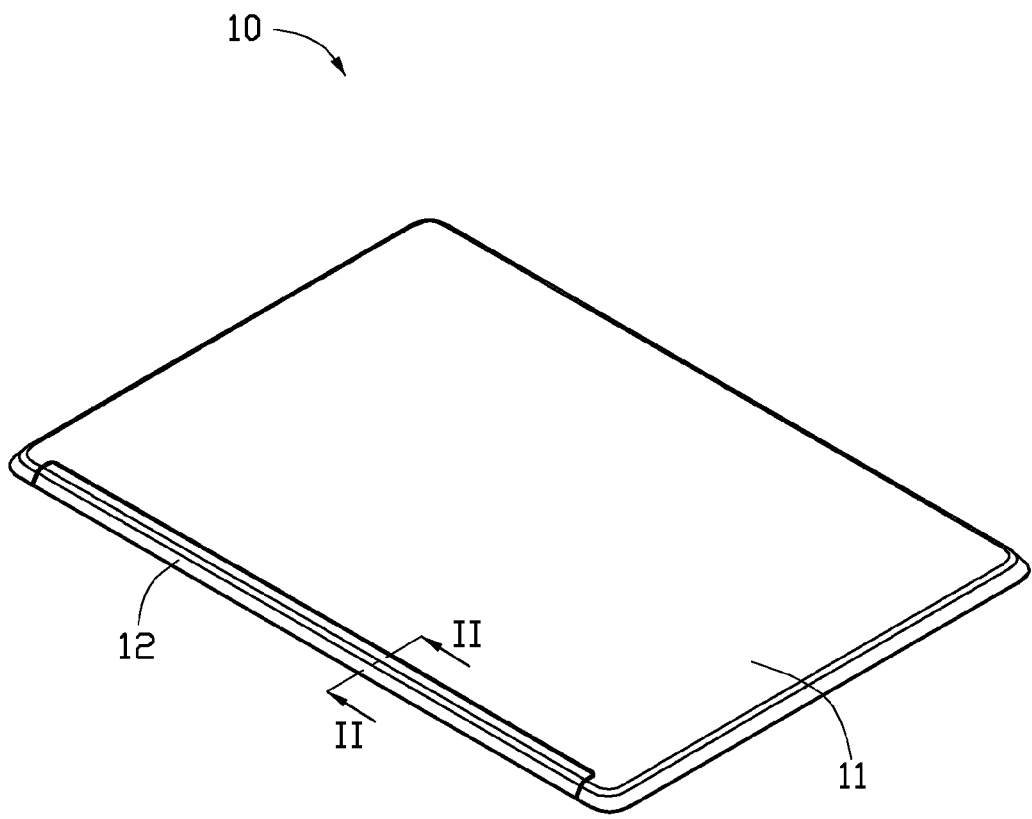
FIG. 1 is an isometric view of an insert-molded cover of the present disclosure in accordance with one preferred embodiment.
Figure 2:
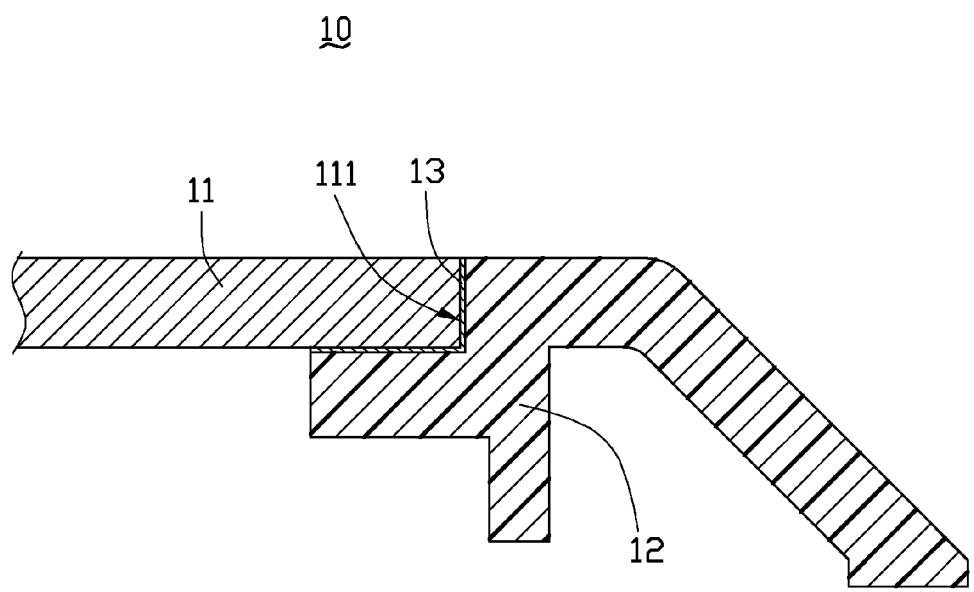
FIG. 2 is a partially, side cross-sectional view of the insert-molded cover, take along the line II-II in FIG. 1.

Referring to FIGS. 1 and 2, an insert-molded cover 10 for electronic devices according to a preferred embodiment is shown. The insert-molded cover 10 includes a metallic body 11, a plastic antenna lid 12, and an oxide film 13 formed on a surface 111 of the metallic body 11 for attaching the plastic antenna lid 12.

The metallic body 11 is substantially a rectangular plate made of alloy, and the alloy is preferably magnesium alloy, aluminum alloy or titanium alloy. In this preferred embodiment, the metallic body 11 is made of magnesium alloy.

The plastic antenna lid 12 is substantially an elongated sheet. The plastic antenna lid 12 is integrally formed on an edge of the metallic body 11. Material of the plastic antenna lid 12 should have a good bonding ability with material of the metallic body 11. In other words, the material of the plastic antenna lid 12 should have a low shrinkage and a similar linear expansion with the material of the metallic body 11. Thus, the material of the plastic antenna lid 12 is selected from the group consisting of liquid crystal polymer (LCP), polyphenylene sulphide (PPS), polybutylene terephthalate (PBT) and their combination.

The oxide film 13 is formed by a chemical method, such as micro-arc oxidation method, anode oxidation method or phosphating conversion method. In this preferred embodiment, the oxide film 13 is formed by micro-arc oxidation method. The thickness of the oxide film 13 is preferably in a range from about 1 micron to about 5 microns. A surface of the oxide film 13 is coarseand has irregular porous structures for attaching the plastic antenna lid 12 in molding process. Thus, the plastic antenna lid 12 and the metallic body 11 are firmly bonded together via the oxide film 13.

A method for manufacturing the insert-molded cover 10 includes following steps.

Firstly, a metallic body 11 is manufactured by casting, forging, or extrusion molding methods.

Secondly, the metallic body 11 is processed by a chemical method, such as micro-arc oxidation, anode oxidation or phosphating conversion methods. Thus, an oxide film 13 is formed on a surface 111 of the metallic body 11. Preferably, the oxide film 13 is formed by the micro-arc oxidation method. The preferred technological condition of the micro-arc oxidation method is as follows: an electric current density is in the range from 100 A/m2 to 150 A/m2, a temperature is in a range from 20 degrees centigrade to 40 degrees centigrade, an electric frequency is in the range from 500 HZ to 800 HZ, and a duty cycle is in the range from 12% to 20%.

Thirdly, a plastic antenna lid 12 is molded on the metallic body 11 by insert molding so that the plastic antenna lid 12 is attached on the oxide film 13. In detail, the metallic body 11 is placed into an injection mold as an insert member, then melted plastic is injected into the injection mold. The oxide film 13 is covered by the melted plastic, the surface of the oxide film 13 is coarse and has irregular porous structures filled with the melted plastic. After the melted plastic is cooled, the plastic antenna lid 12 is firmly attached on the oxide film 13. Thus, the bonding strength of the metallic body 11 and the plastic antenna lid 12 is enhanced via the oxide film 13.

It should be pointed out that, after the first step, the metallic body 11 can be cleaned to remove ashes, oxides or greasy dirt, thus allowing the oxide film 13 to more easier form on the surface of the metallic body 11.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method for manufacturing an insert-molded cover for electronic devices, comprising:
   manufacturing a metallic body having a bottom surface, a top surface parallel to the bottom surface, and a side surface substantially connecting the bottom surface with the top surface;
   providing a plastic antenna lid;
   processing the metallic body by a chemical method and forming an oxide film on the side surface and a part of the bottom surface of the metallic body to be contacting with the plastic antenna lid; and
   molding the plastic antenna lid on the metallic body by insert molding so that the plastic antenna lid is attached on the oxide film, and a top surface of the plastic antenna lid is coplanar with the top surface of the metallic body.

2. The method for manufacturing an insert-molded cover as claimed in claim 1, wherein the metallic body is manufactured by casting, forging, or extrusion molding methods.

3. The method for manufacturing an insert-molded cover as claimed in claim 1, wherein the oxide film is formed by a micro-arc oxidation method.

4. The method for manufacturing an insert-molded cover as claimed in claim 3, wherein an electric current density for the micro-arc oxidation method is in the range from 100 $A/m^2$ to 150 $A/m^2$.

5. The method for manufacturing an insert-molded cover as claimed in claim 3, wherein a temperature for the micro-arc oxidation method is in the range from 20 degrees centigrade to 40 degrees centigrade.

6. The method for manufacturing an insert-molded cover as claimed in claim 3, wherein an electric frequency for the micro-arc oxidation method is in the range from 500 HZ to 800 HZ.

7. The method for manufacturing an insert-molded cover as claimed in claim 3, wherein a duty cycle for the micro-arc oxidation method is in the range from 12% to 20%.

8. The method for manufacturing an insert-molded cover as claimed in claim 3, wherein the oxide film is formed by a method of anode oxidation.

\* \* \* \* \*